United States Patent [19]

Nakashima et al.

[11] Patent Number: 5,417,816
[45] Date of Patent: May 23, 1995

[54] PROCESS FOR PREPARATION OF INDIUM OXIDE-TIN OXIDE POWDER

[75] Inventors: Koichi Nakashima; Toru Saito; Takamasa Maekawa, all of Kitaibaraki, Japan

[73] Assignee: Nikko Kyodo, Ltd., Tokyo, Japan

[21] Appl. No.: 164,125

[22] Filed: Dec. 7, 1993

[30] Foreign Application Priority Data

Dec. 9, 1992 [JP] Japan .................................. 4-352056
Dec. 28, 1992 [JP] Japan .................................. 4-360972
Dec. 28, 1992 [JP] Japan .................................. 4-360973
May 26, 1993 [JP] Japan .................................. 5-146821

[51] Int. Cl.$^6$ ............................................................ C25B 1/00
[52] U.S. Cl. ............................................................ 204/96
[58] Field of Search ................ 204/96, 192.29, 298.13, 204/103, 86

[56] References Cited

U.S. PATENT DOCUMENTS 4,882,014  11/1989  Coyle et al. ........................... 204/1.5
5,071,800  12/1991  Iwamoto et al. ...................... 501/126
5,094,787   3/1992  Nakajima et al. ...................... 264/65
5,116,468   5/1992  Giersberg et al. ...................... 204/96

OTHER PUBLICATIONS

S. B. Saidman, et al., "Stationary and non-stationary Electrochemical Response of Polycrystalline Indium in Alkaline Media", Electrochimica Acta vol. 35 No. 2 pp. 329–338 (1990).

Primary Examiner—Kathryn Gorgos
Assistant Examiner—Brendan Mee

[57] ABSTRACT

An indium oxide-tin oxide powder for ITO display devices etc. with only slight variance in properties such as average particle diameter and apparent density is prepared stably with good controllability and at low cost: (1) by electrolyzing indium as an anode, calcining or roasting the indium hydroxide obtained and combining the resulting indium oxide powder with a tin oxide powder; (2) by electrolyzing tin as an anode, calcining or roasting the metastannic acid obtained and combining the resulting tin oxide powder with an indium oxide powder; (3) by simultaneously electrolyzing indium and tin as separate anodes and then calcining or roasting the resulting mixed precipitate of indium hydroxide and metastannic acid to produce an indium oxide-tin oxide powder; or (4) by electrolyzing an alloy of indium and tin as an anode and then calcining or roasting the resulting precipitate of indium hydroxide and metastannic acid to produce an indium oxide-tin oxide powder.

11 Claims, 6 Drawing Sheets

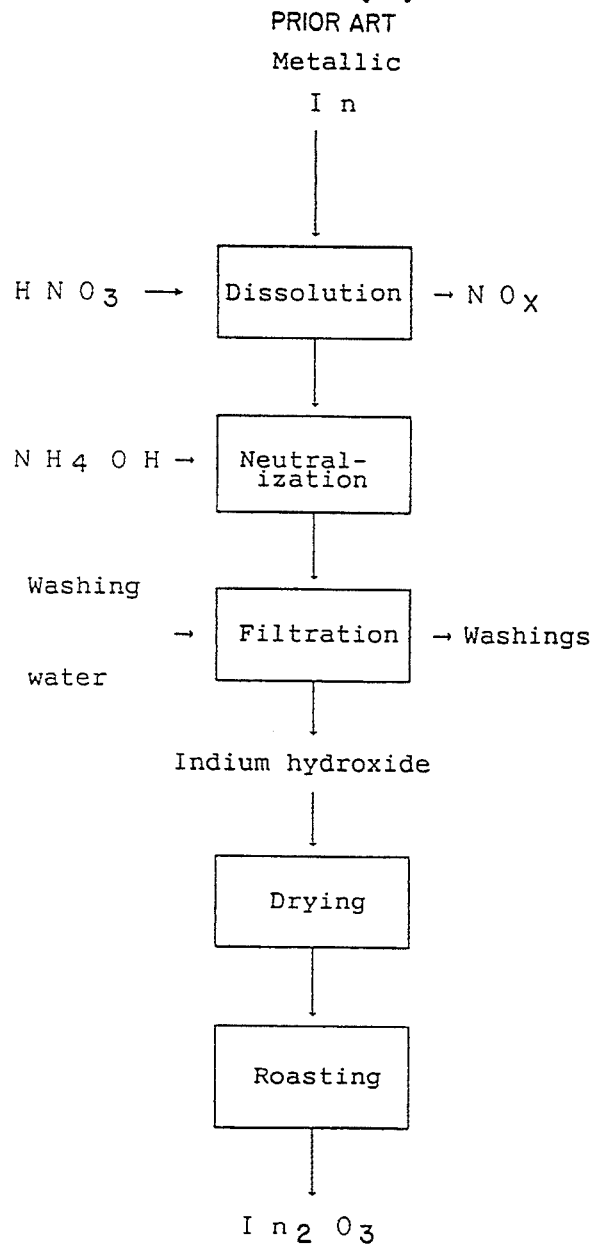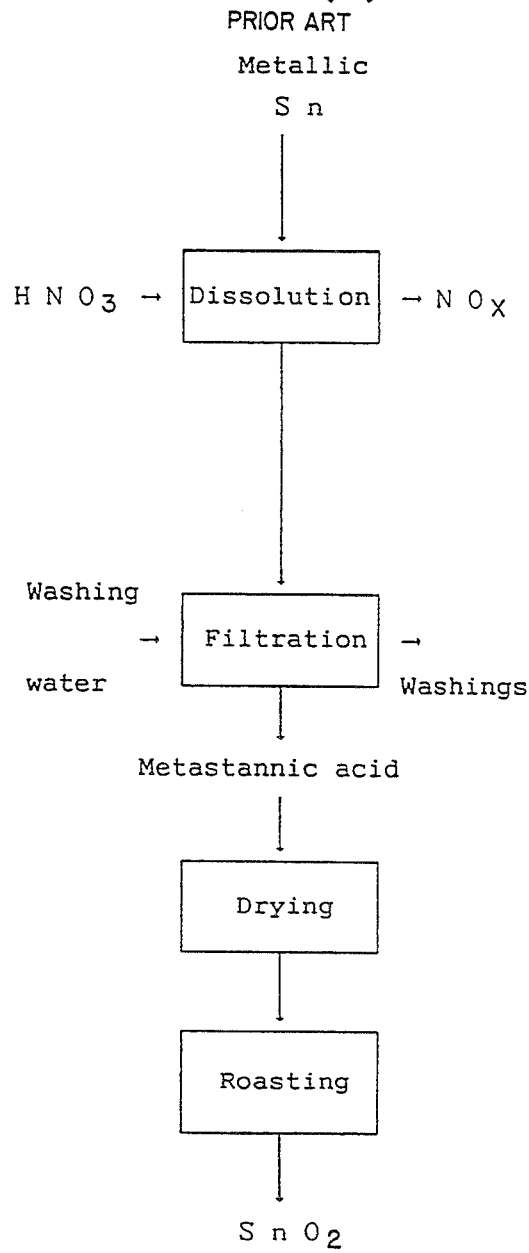

PROCESS FOR PREPARATION OF INDIUM OXIDE-TIN OXIDE POWDER

FIELD OF THE INVENTION

This invention relates to a process for the preparation of an indium oxide-tin oxide powder (a powdery mixture of indium oxide powder and tin oxide powder, usually containing 5-30 wt % tin oxide, hereinafter referred to as "ITO powder") suited as a material from which ITO (Indium-Tin Oxide) films and other indium oxide-based display members are produced.

BACKGROUND OF THE INVENTION

Indium that occurs in very small amounts in zinc ores is obtained as a by-product of zinc refining, and as the knowledge of its interesting properties has gradually spread, many proposals have been made as to its use. More recently, the high electric conductivity and transparency of thin films of indium oxides, especially the Sn-containing indium oxide ($In_2O_3$—$SnO_2$) known as "ITO", have attracted much attention. This has led to the development of diverse applications, including liquid crystal display devices, thin-film electroluminescence display units, radioactive detector elements, and clear tablets of terminal equipments etc.

The indium oxide powder and tin oxide powder as starting materials for the manufacture of the above ITO films and others have hitherto been made, respectively, in the sequences of process steps shown at (a) and (b) in FIG. 6.

In the case of indium oxide powder, as shown in FIG. 6(a), the first stage starts with the dissolution of metallic indium with nitric acid, and the solution is neutralized with ammonia water to allow the product to settle as indium hydroxide. This precipitate or deposit (indium hydroxide) is then filtered, rinsed, and dried. Next, at the second stage, the resulting indium hydroxide is calcined or roasted to indium oxide powder.

For tin oxide powder, at the first stage in FIG. 6 (b), metallic tin is dissolved with nitric acid and allowed to settle as metastannic acid. The precipitate or deposit (metastannic acid) is filtered, rinsed, and dried. At the second stage, the metastannic acid so obtained is calcined or roasted to tin oxide powder.

The indium oxide powder and tin oxide powder thus prepared are often mixed and sintered to form a sputtering target or the like, which is then used as a material for forming a thin film, e.g., by sputtering.

However, it has been pointed out that the above processes for preparing indium oxide powder and tin oxide powder present the following problems:

a) The oxide powders thus obtained vary largely in their properties (average particle diameter, apparent density, etc.). This hampers the reduction of variance of qualitative uniformity or the improvement for higher quality of the ITO type display materials.

b) The manufacturing conditions (solution temperature, reaction rate, etc.) are not always easy to control uniformly throughout. Stabilizing the conditions requires additional equipment cost.

c) When a new need arises for powders dissimilar in properties to those currently in use, it cannot be met flexibly.

d) The manufacturing equipment is relatively large in scale, and uniform control of the operating conditions requires considerable labor, and yet a requirement for increased production cannot necessarily be met with ease.

e) Dissolution waste liquor (e.g., of ammonium nitrate) results from each cycle of process and has to be disposed of, adding to the running cost.

OBJECT OF THE INVENTION

With these in view, the object of the present invention is to establish the means capable of overcoming the foregoing difficulties and providing an indium oxide-tin oxide powder having excellent properties fully satisfactory as a material for display articles, with good productivity and stability at low cost.

SUMMARY OF THE INVENTION

Investigations made from varied viewpoints to achieve the above object have now led to the following findings:

(1) Indium hydroxide, a substance to be calcined or roasted to indium oxide, can be prepared under stabilized conditions at relatively low equipment and running costs if an electrolytic process is adopted in place of the dissolution, neutralization and settling process of the prior art. The indium oxide powder that results from the calcining or roasting has very broad acceptable ranges of various properties (including the average particle diameter and apparent density). Moreover, judicious choice of the electrolysis conditions permits fine control of those properties.

(2) Metastannic acid, a substance to be calcined or roasted to tin oxide, can be prepared under stabilized conditions at relatively low equipment and running costs if an electrolytic process rather than the dissolution-settling process of the prior art is adopted. The tin oxide powder that results from the calcining or roasting has very broad acceptable ranges of various properties (including the average particle diameter and apparent density). Moreover, proper choice of the electrolysis conditions permits fine control of those properties.

(3) If, in preparing mixed oxide powders of indium and tin, an electrolytic process is adopted instead of the conventional separate processes at the first stage, wherein indium and tin as separate anodes are simultaneously treated by electrolysis, then a mixed precipitate of indium hydroxide and metastannic acid can be directly prepared in a single step under stable conditions at relatively low equipment and running costs. Calcining or roasting of this mixed precipitate yields an ITO powder (a mixed powder of indium oxide and tin oxide powders) having very broad acceptable ranges of various properties (including the average particle diameter and apparent density) in a stable way. Those properties can be finely controlled through proper selection of the electrolysis conditions.

(4) If, in preparing mixed oxide powders of indium and tin, an electrolytic process is adopted instead of the conventional separate processes at the first stage, wherein an alloy of indium and tin as an anode is treated by electrolysis, then a mixed precipitate of indium hydroxide and metastannic acid can be directly prepared in a single step under stable conditions at relatively low equipment and running costs. Calcining or roasting of this mixed precipitate gives an ITO powder having very broad acceptable ranges of various properties (including the average particle diameter and apparent density) in a stable way. Those properties can be finely controlled through proper selection of the electrolysis conditions.

Thus, based on the above findings, the present invention provides:

(1) a process for the preparation of an indium oxide-tin oxide powder which comprises electrolyzing indium as an anode to produce a precipitate of indium hydroxide, calcining or roasting the precipitate of indium hydroxide thus obtained to produce indium oxide, and combining the resulting indium oxide powder with a tin oxide powder; and (2) a process for the preparation of an indium oxide-tin oxide powder which comprises electrolyzing tin as an anode to produce a precipitate of metastannic acid, calcining or roasting the metastannic acid thus obtained to produce tin oxide, and combining the resulting tin oxide powder with an indium oxide powder.

In either case, the use of aqueous ammonium nitrate solution as the electrolyte is desirable. Also, it is recommendable to combine the indium oxide powder prepared in (1) and the tin oxide powder prepared in (2) above.

The invention further provides:

(3) a process for the preparation of an indium oxide-tin oxide powder which comprises simultaneously electrolyzing indium and tin as separate anodes to produce a mixed precipitate of indium hydroxide and metastannic acid and calcining or roasting the resulting mixed precipitate of indium hydroxide and metastannic acid to produce a mixed indium oxide-tin oxide powder; and (4) a process for the preparation of an indium oxide-tin oxide powder which comprises electrolyzing an alloy of indium and tin as an anode to produce a mixed precipitate of indium hydroxide and metastannic acid and calcining or roasting the resulting mixed precipitate of indium hydroxide and metastannic acid to produce a mixed indium oxide-tin oxide powder.

In either case the electrolyte used is preferably an aqueous solution of ammonium nitrate.

BRIEF DESCRIPTION OF THE DRAWINGS

FIG. 6(a) and FIG. 6(b) are flow sheets of prior art processes for preparing indium oxide powder and tin oxide powder, respectively.

DETAILED DESCRIPTION OF THE INVENTION (1) Preparation of indium oxide powder

A first aspect of the present invention is principally characterized in that, in the preparation of indium oxide-tin oxide powder, an indium oxide powder with only slight variation in properties such as average particle diameter and apparent density can be obtained stably at low cost, with easy control of the properties, by calcining or roasting indium hydroxide that has resulted from the electrolysis of indium as an anode.

As stated above, the process for the preparation of indium oxide powder, unlike the prior art processes, comprises first electrolyzing metallic indium as an anode in an electrolyte, thereby precipitating indium hydroxide, and then calcining (roasting) the indium hydroxide. The electrolyte to be used for the anodic electrolysis of indium is not particularly specified. Any ordinary electrolyte such as ammonium nitrate or ammonium sulfate may be employed but, if anything, an aqueous solution of ammonium nitrate is preferred in consideration of the cost and maintenance of product purity.

The electrolytic process for precipitating indium hydroxide may be either the conventional "plane-wave" electrolysis or the PR electrolysis using a periodically reversible current.

Judicious choice of the electrolytic conditions for the preparation of indium hydroxide makes possible the control of the average particle diameter, specific surface area, apparent density, and other properties of the indium oxide powder that is obtained after subsequent calcining (roasting). Proper adjustments of these properties lead to marked improvements in the quality of the indium oxide-based product, such as a display or fluorescent material.

Since these properties of indium oxide powder can be confirmed relatively easily by X-ray diffraction analysis, one may simply grasp the appropriate conditions for the powder preparation.

Figure 1:
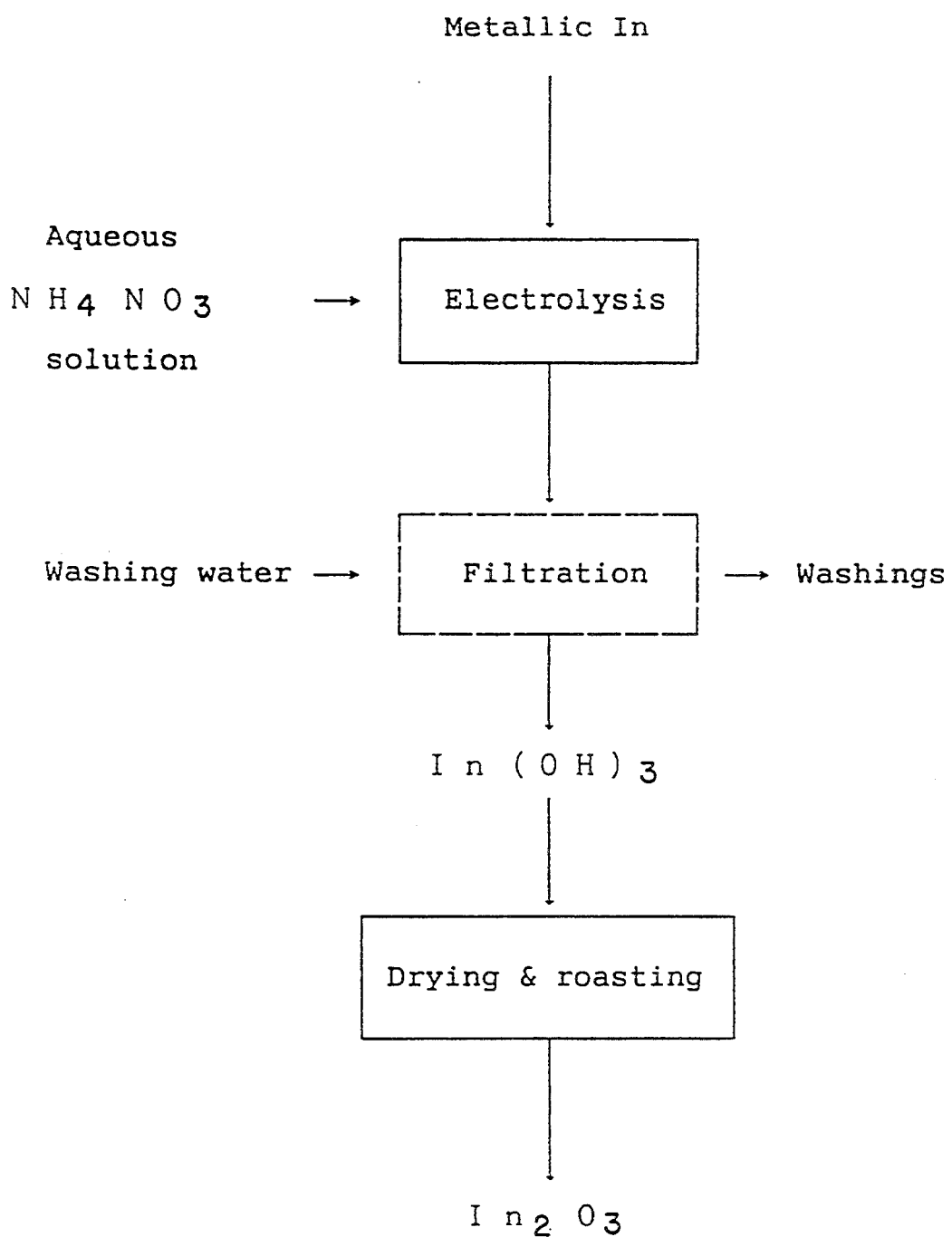
FIG. 1 is a flow sheet of the process for preparing indium oxide powder in a first aspect of the present invention for the preparation of ITO powder.

There is shown in FIG. 1 a typical sequence of steps for the preparation of indium oxide powder by the electrolytic process according to the first aspect of the present invention.

Here, in the flow of process illustrated in FIG. 1, the indium oxide powder can be prepared more stably in the following manner. The electrolysis of indium into indium hydroxide to be calcined or roasted subsequently is preferably carried out in an aqueous solution of ammonium nitrate at an $NH_4NO_3$ concentration of 0.2–5 mol/l, pH of 4–9.5, and at a bath temperature of 0°–50° C., and it is advisable to control the current density within the range of 100–1800 $A/m^2$.

If the $NH_4NO_3$ concentration in the electrolytic bath (aqueous solution of ammonium nitrate) is below 0.2 mol/l, a current efficiency drop or power unit increase can result. A concentration beyond 5 mol/l, on the other hand, involves a significant increase in consumption of the chemical.

A bath with a pH below 4 makes too fine a hydroxide for solid-liquid separation, while a bath with pH 9.5 or upwards is usually avoided because the handling of such a high pH bath would pose a problem of safety or environmental protection.

As for the bath temperature, adjusting it below 0° C. is disadvantageous from the standpoint of cooling cost involved. Maintaining it above 50° C. is not warranted by reason of heating cost. With $NH_4NO_3$ in particular, an environmental measure against the evolution of ammonia vapor becomes a necessity.

A current density of less than 100 A/m² requires larger equipment and yet brings rather unfavorable productivity. A density in excess of 1800 A/m² boosts the bath voltage to an economical disadvantage.

It may well be said that this aspect of the present invention contributes tremendously to the industry since it offers the following advantages:

a) The indium oxide powder thus obtained has broad acceptable ranges of various properties (including the average particle diameter and apparent density), which can be finely and closely controlled through adequate choice of the electrolytic conditions.

b) A continuous process can be used because indium hydroxide, the intermediate material to be calcined or roasted is prepared by electrolysis. The process permits easy qualitative control and ensures stability of the quality itself, as compared with the conventional batch (neutralization) process.

c) The properties of the finally obtained indium oxide powder can be delicately controlled through selection of the electrolytic conditions. This results in qualitative improvements and reduction of qualitative variation of the ITO film display and fluorescent materials using that powder.

d) The operation in a "closed system" permits a substantial saving of the running cost as compared with the conventional process that generates waste liquor of ammonium nitrate after each run of neutralization.

e) The equipment being compact in design, the initial investment (construction cost) is so low that an increased production can be realized with ease when the necessity arises.

The indium oxide powder produced gives excellent result particularly when it is mixed with tin oxide and when an ITO sputtering target fabricated from the mixture is used in forming an ITO film.

(2) Preparation of tin oxide powder

A second aspect of the present invention is importantly characterized in that, in the preparation of indium oxide-tin oxide powder, a tin oxide powder with only slight variance in properties such as average particle diameter and apparent density can be obtained stably at low cost, with easy control of the properties, by calcining or roasting metastannic acid that has resulted from the electrolysis of tin as an anode.

In the process for the preparation of tin oxide powder, unlike the prior art processes, metallic tin is electrolyzed first as an anode in an electrolyte to precipitate metastannic acid, and then it is calcined (roasted). The electrolyte to be used for the anodic electrolysis of tin is not particularly specified. Any ordinary electrolyte such as ammonium nitrate or ammonium sulfate may be employed but, when cost and purity of the product are to be taken into account, an aqueous solution of ammonium nitrate is preferred.

The electrolytic process for precipitating metastannic acid may be either the conventional "plane-wave" electrolysis or the PR electrolysis using a periodically reversible current.

Proper choice of the electrolytic conditions for the preparation of metastannic acid makes possible the control of the average particle diameter, specific surface area, apparent density, and other properties of the tin oxide powder that is obtained after subsequent calcination. Adjustments of these properties lead to marked improvements in the quality of the tin oxide-based product, such as a display or fluorescent material.

Figure 2:
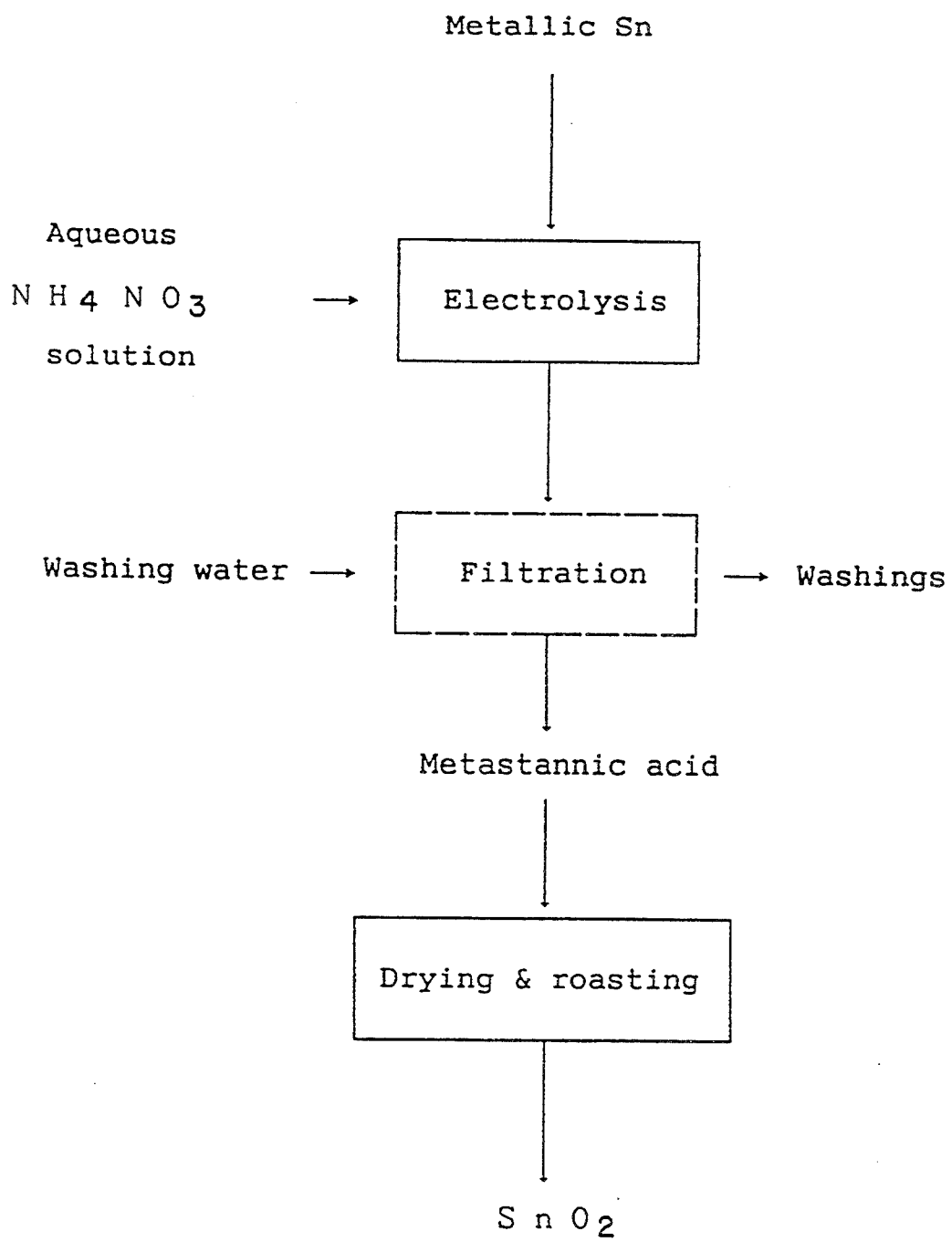
FIG. 2 is a flow sheet of the process for preparing tin oxide powder in a second aspect of the invention.

FIG. 2 shows a typical sequence of steps for the preparation of tin oxide powder by the electrolytic process according to the present invention.

Here, in the flow of process illustrated in FIG. 2, the tin oxide powder can be prepared more stably in the following manner. The electrolysis of tin into metastannic acid to be calcined or roasted subsequently is preferably conducted in an aqueous solution of ammonium nitrate at an $NH_4NO_3$ concentration of 0.2–5 mol/l, pH of 4–9.5, and at a bath temperature of 0°–50° C., and it is advisable to control the current density within the range of 100–1800 A/m².

If the $NH_4NO_3$ concentration in the electrolytic bath (aqueous solution of ammonium nitrate) is below 0.2 mol/l, a current efficiency drop or power unit increase can result. A concentration beyond 5 mol/l, on the other hand, involves a significant increase in consumption of the chemical.

A bath with a pH below 4 makes too fine a precipitated hydroxide for solid-liquid separation, while a bath with pH 9.5 or upwards is usually avoided because the handling of such a high pH bath would pose a problem of safety or environmental protection.

As for the bath temperature, adjusting it below 0° C. is disadvantageous from the standpoint of cooling cost. Maintaining it above 50° C. is not warranted by reason of heating cost. With $NH_4NO_3$ in particular, an environmental measure against the evolution of ammonia vapor becomes a necessity.

A current density of less than 100 A/m² affects the productivity adversely. A current density exceeding 1800 A/m² boosts the bath voltage to an economical disadvantage.

It can well be said that the process of the invention for the preparation of fine oxide contributes greatly to the industry since it offers the following advantages:

a) The tin oxide powder thus obtained has broad acceptable ranges of various properties (including the average particle diameter and apparent density), which can be finely and closely controlled through adequate choice of the electrolytic conditions.

b) A continuous process can be used because metastannic acid, the intermediate material to be calcined or roasted, is prepared by electrolysis. The process permits easy qualitative control and ensures stability of the quality itself, as compared with the conventional batch (dissolution-precipitation) process.

c) The properties of the finally obtained tin oxide powder can be delicately controlled through selection of the electrolytic conditions. This results in qualitative improvements and reduction of qualitative variance of the ITO film display and fluorescent materials using that powder.

d) The operation in a "closed system" permits a substantial saving of the running cost as compared with the conventional process that generates waste liquor of nitric acid after each run of dissolution and precipitation.

e) The equipment being compact in design, the initial investment (construction cost) is low and an increased production can be realized with ease when the necessity arises.

The tin oxide powder produced gives excellent result particularly when it is mixed with indium oxide and when an ITO sputtering target fabricated from the mixture is used in forming an ITO film.

An even better ITO film can be formed from a target of a mixed powder combining the indium oxide powder obtained in (1) above and the tin oxide powder obtained in (2).

(3) Preparation of indium oxide-tin oxide powder by simultaneous electrolysis of indium and tin anodes A third aspect of the present invention is significantly characterized in that an ITO powder with merely slight variance in properties such as average particle diameter and apparent density can be obtained stably at low cost, with easy control of the properties, by simultaneous electrolysis of indium and tin as separate anodes and by calcining or roasting a mixed precipitate (deposit) of the resulting indium hydroxide and metastannic acid.

Here, the process comprises electrolyzing metallic indium and metallic tin as separate anodes in an electrolyte, thereby effecting simultaneous precipitation of indium hydroxide and metastannic acid, and then calcining (roasting) the mixed precipitate. The electrolyte to be used for the anodic electrolysis of these metals is not particularly specified. Any ordinary electrolyte such as ammonium nitrate or ammonium sulfate may be employed but, from the viewpoints of cost and purity of the product, an aqueous solution of ammonium nitrate is preferred.

The electrolytic process for simultaneously precipitating indium hydroxide and metastannic acid may be either the conventional "plane-wave" electrolysis or the PR electrolysis using a periodically reversible current.

Suitable choice of the electrolytic conditions for the precipitation of indium hydroxide and metastannic acid makes possible the control of the average particle diameter, specific surface area, apparent density, and other properties of the ITO powder that is obtained after subsequent calcining or roasting. Adjustments of these properties lead to marked improvements in the quality of the ITO powder or ITO powder-based product, such as a display or fluorescent material.

Figure 3:
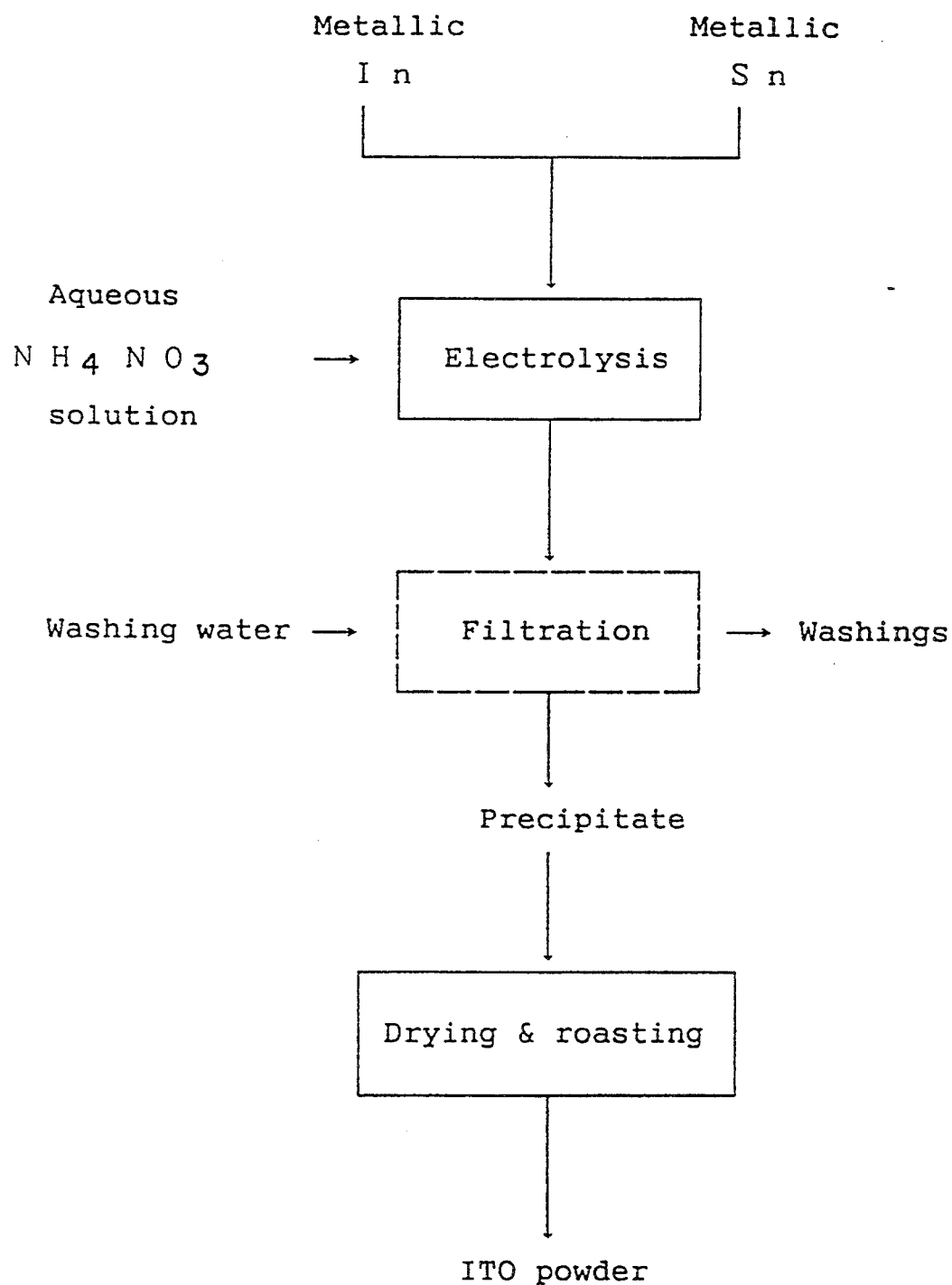
FIG. 3 is a flow sheet of the process for preparing indium oxide-tin oxide powder in a third aspect of the invention.

FIG. 3 shows a typical sequence of steps for the preparation of ITO powder by the electrolytic process according to the third aspect of the present invention.

Here, in the flow of process illustrated in FIG. 3, the ITO powder can be prepared more stably in the following manner. The electrolysis for obtaining a mixed precipitate of indium hydroxide and metastannic acid to be calcined or roasted subsequently is preferably carried out in an aqueous solution of ammonium nitrate at an $NH_4NO_3$ concentration of 0.2–5 mol/l, pH of 4–9.5, and a bath temperature of 0°–50° C., and it is advisable to control the current density within the range of 100–1800 $A/m^2$.

If the $NH_4NO_3$ concentration in the electrolytic bath (aqueous solution of ammonium nitrate) is below 0.2 mol/l, a current efficiency drop or power unit increase can result. A concentration beyond 5 mol/l, on the other hand, involves a significant increase in consumption of the chemical.

A bath with a pH below 4 makes too fine a precipitate produced for solid-liquid separation, while a bath with pH 9.5 or upwards is usually avoided because the handling of such a high pH bath would pose a problem of safety or environmental protection.

As for the bath temperature, adjusting it below 0° C. is disadvantageous from the standpoint of cooling cost. Maintaining it above 50° C. is not warranted by reason of heating cost. With $NH_4NO_3$ in particular, an environmental measure against the evolution of ammonia vapor becomes a necessity.

A current density of less than 100 $A/m^2$ affects the productivity adversely. A density exceeding 1800 $A/m^2$ boosts the bath voltage to a level economically unjustified.

This aspect of the invention promises great contribution to the industry since it offers the following advantages:

a) The tin oxide powder thus obtained has broad acceptable ranges of various properties (including the average particle diameter and apparent density), which can be finely and closely controlled through adequate choice of the electrolytic conditions.

b) A continuous process can be used because the mixed precipitate of indium hydroxide and metastannic acid, the intermediate material to be calcined or roasted, is prepared in one step by electrolysis. The process permits easy qualitative control and ensures stability of the quality itself, as compared with the conventional batch process.

c) The properties of the finally obtained ITO powder can be delicately controlled through selection of the electrolytic conditions. This results in qualitative improvements and reduction of qualitative variance of the ITO or ITO-based display and fluorescent materials using the same.

d) According to this procedure, a mixed precipitate obtained by co-electrolysis is calcined or roasted to an ITO powder, practically without going through a mixing step, as compared with the conventional process of mixing separately prepared oxides (indium oxide and tin oxide) into an ITO powder. This process performs more uniform mixing of the oxides, giving a highly homogeneous ITO powder.

e) The operation in a "closed system" permits a substantial saving of the running cost as compared with the conventional process that generates waste liquor of nitric acid after each run of precipitation operation.

f) The manufacturing equipment being compact in design, the initial investment (construction cost) is low and the process lends itself easily to an increased production when the necessity arises.

(4) Preparation of indium oxide-tin oxide powder by electrolysis of an indium-tin alloy anode A fourth aspect of the present invention is greatly characterized in that an ITO powder with merely slight variance in properties such as average particle diameter and apparent density can be obtained stably at low cost, with easy control of the properties, by electrolysis of an indium-tin alloy as an anode and by calcining or roasting a mixed precipitate of indium hydroxide and metastannic acid so obtained.

Here, the process comprises electrolyzing an alloy of indium and tin as an anode in an electrolyte, thereby effecting simultaneous precipitation of indium hydroxide and metastannic acid, and then calcining (roasting) the mixed precipitate. The electrolyte to be used for the anodic electrolysis of the alloy is not particularly specified. Any ordinary electrolyte such as ammonium nitrate or ammonium sulfate may be employed but, in consideration of the cost and the maintenance of product purity, an aqueous solution of ammonium nitrate is preferred.

The composition of the alloy used as an anode depends upon the composition of the mixed precipitate desired. Usually, In—Sn alloy containing 5-30 wt % Sn may be used.

The electrolytic process for simultaneously precipitating indium hydroxide and metastannic acid may be either the conventional "plane-wave" electrolysis or the PR electrolysis using a periodically reversible current.

Proper choice of the electrolytic conditions for the precipitation of indium hydroxide and metastannic acid makes possible the control of the average particle diameter, specific surface area, apparent density, and other properties of the ITO powder that is obtained after subsequent calcining or roasting. Adjustments of these properties lead to marked improvements in the quality of the ITO powder or ITO powder-based materials such as a display or fluorescent material.

Figure 4:
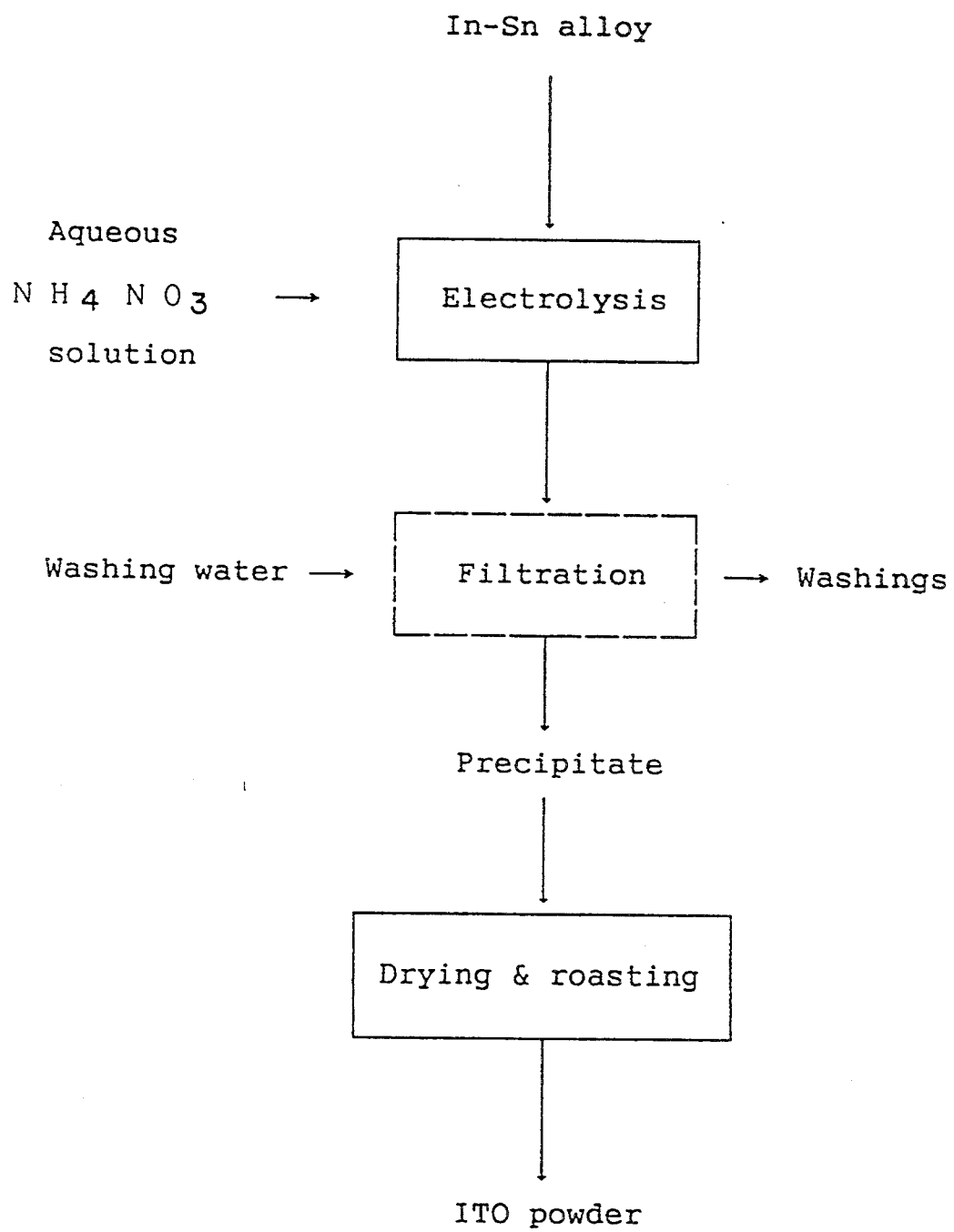
FIG. 4 is a flow sheet of the process for preparing indium oxide-tin oxide powder in a fourth aspect of the invention.

FIG. 4 shows a typical sequence of steps for the preparation of ITO powder by the electrolytic process according to this aspect of the present invention.

Here, in the flow of process illustrated in FIG. 4, the ITO powder can be prepared more stably in the following manner. The electrolysis for obtaining a mixed precipitate of indium hydroxide and metastannic acid to be calcined or roasted subsequently is preferably performed in an aqueous solution of ammonium nitrate at an $NH_4NO_3$ concentration of 0.2-5 mol/l, pH of 4-9.5, and a bath temperature of 0°-50° C., and it is advisable to control the current density within the range of 100-1800 $A/m^2$.

If the $NH_4NO_3$ concentration in the electrolytic bath (aqueous solution of ammonium nitrate) is below 0.2 mol/l, a current efficiency drop or power unit increase can result. A concentration beyond 5 mol/l, on the other hand, renders the chemical consumption no longer negligible.

A bath with a pH below 4 makes too fine a precipitate for solid-liquid separation, while a bath with pH 9.5 or upwards is usually avoided because the handling of such a high pH bath would pose a problem of safety or environmental protection.

As for the bath temperature, adjusting it below 0° C. is disadvantageous from the standpoint of cooling cost. Maintaining it above 50° C. is not warranted by reason of heating cost. With $NH_4NO_3$ in particular, an environmental measure against the evolution of ammonia vapor becomes a necessity.

A current density of less than 100 $A/m^2$ deteriorates the productivity. A density exceeding 1800 $A/m^2$ boosts the bath voltage to a level economically unjustified.

The preparation of ITO powder in accordance with this procedure of the present invention brings great contribution to the industry since it offers the following advantages:

a) The ITO powder thus obtained has broad acceptable ranges of various properties (including the average particle diameter and apparent density), which can be finely and closely controlled through the choice of adequate electrolytic conditions.

b) A continuous process can be used because the mixed precipitate of indium hydroxide and metastannic acid, the intermediate material to be calcined or roasted, is prepared in one step by electrolysis. The process permits easy qualitative control and ensures stability of the quality itself, as compared with the conventional batch operation.

c) The properties of the finally obtained ITO powder can be delicately controlled through selection of the electrolytic conditions. This results in qualitative improvements and reduction of qualitative variance of the ITO or ITO-based display and fluorescent materials using the same.

d) According to this process, a mixed precipitate obtained by co-electrolysis is calcined or roasted directly to an ITO powder, practically without going through a mixing step, as compared with the conventional process of mixing separately prepared oxides (indium oxide and tin oxide) into an ITO powder. This process performs more uniform mixing of the oxides, giving a highly homogeneous ITO powder.

e) The operation in a "closed system" permits a substantial saving of the running cost as compared with the conventional process that generates waste liquor of nitric acid and ammonium nitrate after each run of neutralization.

f) The manufacturing equipment being compact in design, the initial investment (construction cost) is low and the process lends itself easily to an increased production when the necessity arises.

Figure 5:
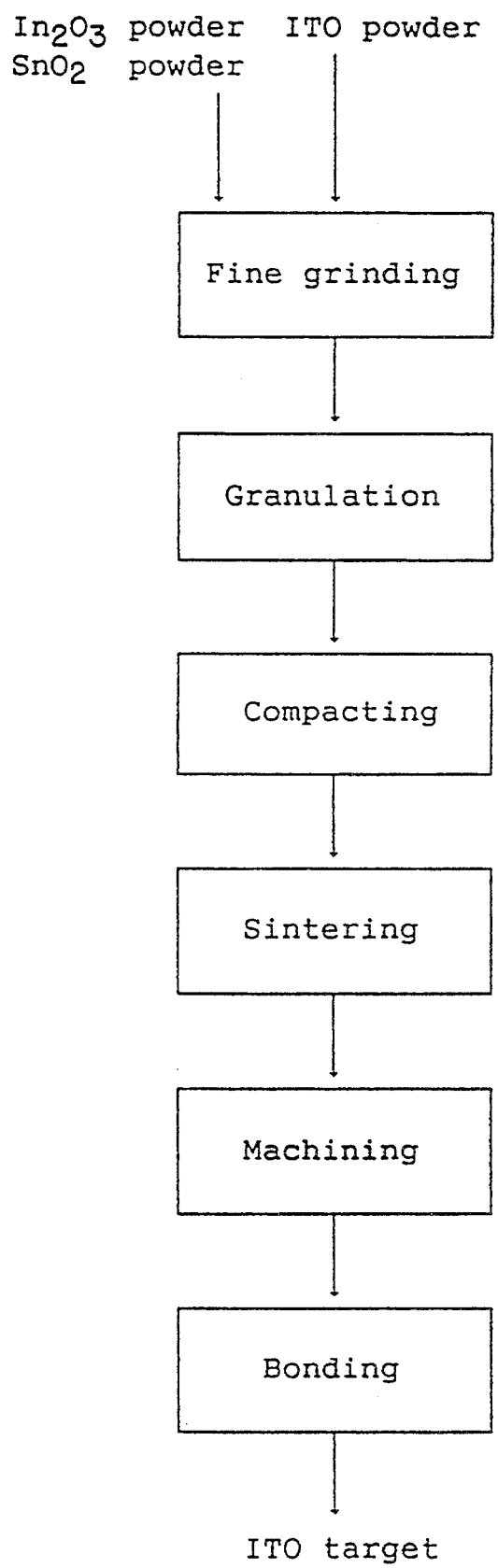
FIG. 5 is a flow sheet of the process for fabricating an ITO sputtering target from either indium oxide and tin oxide powders or ITO powder.

The powder prepared in conformity with the invention gives particularly desirable results when it is fabricated into an ITO sputtering target and used in forming an ITO film. Fabrication of the ITO target from the $In_2O_3$ and $SnO_2$ powders or the ITO powder usually follows the flow of process shown in FIG. 5 wherein the starting powders are ground and granulated and then compacted to a desired shape and the subjected to sintering to a high density sintered body. Then, it is machined and finished to a target and then bonded to a backing plate.

The terms "calcining" and "roasting" are used herein interchangeably used and means that the precipitae such as indium hydroxide or metastannic acid is heated until they are converted to oxide form.

EXAMPLES

The present invention is illustrated by the following Examples which are set forth for illustration purpose only.

Example 1-1

In an aqueous solution of ammonium nitrate ($NH_4NO_3$ concentration=0.5 mol/l, pH=8) at 10° C., metallic indium was electrolyzed as an anode at a cathode current density of 1200 $A/m^2$. The resulting precipitate depositing at the bottom of the electrolytic bath was filtered, rinsed, and dried to obtain indium hydroxide.

It gave, upon roasting at 1100° C., an indium oxide powder having an average particle diameter of 2.8 $\mu m$ and an apparent density of 1.99 $g/cm^3$.

From this indium oxide and separately prepared tin oxide, an ITO sputtering target containing 10 wt % $SnO_2$ was fabricated by cold-press atmospheric sintering. The sintered body thus obtained had a density of 4.88 $g/cm^3$.

A clear conductive film formed by sputtering this ITO target was tested for their properties such as sheet resistance and transmissivity. The results were satisfied and assured that the film was quite useful for a liquid crystal display (LCD).

Example 1-2

Electrolysis of metallic indium was carried out under the same conditions as described in Example 1-1 with the exception that an aqueous solution of ammonium nitrate at an $NH_4NO_3$ concentration of 1.0 mol/l and pH of 6 was used as the electrolytic bath at 50° C. The precipitate depositing at the bottom of the electrolytic cell was filtered, rinsed, and dried to obtain indium hydroxide.

It was then roasted at 1100° C., and an indium oxide powder having an average particle diameter of 0.47 μm and an apparent density of 0.84 g/cm$^3$ was obtained.

Using the indium oxide so obtained, an ITO sputtering target containing 10 wt % $SnO_2$ was fabricated in the manner described in Example 1-1. The resulting sintered body had a density of 4.78 g/cm$^3$.

This ITO target was sputtered and a clear conductive film that resulted was tested for its sheet resistance, transmissivity, and other properties. It was confirmed that it gave results satisfactory for use in LCD.

Example 2-1

In an aqueous solution of ammonium nitrate ($NH_4NO_3$ concentration=0.5 mol/l, pH=8) at 10° C., metallic tin was electrolyzed as an anode by periodic reverse (PR) pulse current electrolysis at a cathode current density of 600 A/m$^2$. The resulting precipitate depositing at the bottom of the electrolytic cell was filtered, rinsed, and dried to obtain metastannic acid.

It gave, upon roasting at 1100° C., a tin oxide powder had uniform particles within a fine, limited particle size range and exhibited high apparent specific gravity.

From this tin oxide and separately prepared indium oxide, an ITO sputtering target containing 10 wt % $SnO_2$ was fabricated by cold-press atmospheric sintering. The sintered target thus obtained had a density of 4.88 g/cm$^3$.

A clear conductive film formed by sputtering this ITO target was tested for their properties such as sheet resistance and transmissivity. The results were satisfactory and made it certain that the film was quite useful for LCD.

EXAMPLE 2-2

Electrolysis of metallic tin was carried out using a periodic reverse pulse current under the same conditions as described in Example 2-1 with the exception that an aqueous solution of ammonium nitrate at an $NH_4NO_3$ concentration of 1.0 mol/l and pH of 6 was used as the electrolytic bath at 50° C. The precipitate at the bottom of the electrolytic cell was filtered, rinsed, and dried to obtain indium hydroxide.

It was roasted at 1100° C. to give, in this case again, a tin oxide powder had uniform particles within a fine, limited particle size range and exhibited high apparent specific gravity.

Using the resulting tin oxide and in the manner described in Example 2-1, an ITO sputtering target containing 10 wt % $SnO_2$ was fabricated. The sintered target thus obtained had a density of 4.78 g/cm$^3$.

A clear conductive film formed by sputtering this ITO target was tested for their properties such as sheet resistance and transmissivity. The results were satisfactory and made it certain that the film was quite useful for LCD.

Example 3-1

In an aqueous solution of ammonium nitrate ($NH_4NO_3$ concentration=0.5 mol/l, pH=8) at 10° C., metallic indium and metallic tin of different surface areas were electrolyzed as anodes using a periodic reverse pulse current at a cathode current density of 600 A/m$^2$ each. The resulting precipitate at the bottom of the electrolytic cell was filtered, rinsed, and dried to obtain a mixed precipitate of indium hydroxide and metastannic acid.

It gave, upon roasting at 1100° C., an ITO powder having an average particle diameter of 20 μm and an apparent density of 1.7 g/cm$^3$.

From this ITO powder, an ITO sputtering target containing 10 wt % $SnO_2$ was fabricated by cold-press atmospheric sintering. The sintered body thus obtained had a density of 6.70 g/cm$^3$.

A clear conductive film formed by sputtering this ITO target was tested for their properties such as sheet resistance and transmissivity. The results were satisfactory and proved that the film was quite useful for LCD.

Example 3-2

Electrolysis was carried out using a periodic reverse pulse current under the same conditions as described in Example 3-1 with the exception that an aqueous solution of ammonium nitrate at an $NH_4NO_3$ concentration of 1.0 mol/l and pH 6 was used as the electrolytic bath at 50° C. The precipitate at the bottom of the electrolytic cell was filtered, rinsed, and dried to obtain a mixed precipitate of indium hydroxide and metastannic acid.

It was roasted at 1100° C. to give an ITO powder of a uniform particle diameter and high apparent specific gravity.

Using the resulting ITO powder and in the manner described in Example 3-1, an ITO sputtering target containing 10 wt % $SnO_2$ was made. The sintered body thus obtained had a density of 4.78 g/cm$^3$.

A clear conductive film formed by sputtering this ITO target was tested for their properties such as sheet resistance and transmissivity. The results made it certain that the film was very satisfactory and useful for LCD.

Example 4-1

In an aqueous solution of ammonium nitrate ($NH_4NO_3$ concentration=0.5 mol/l, pH=8) at 10° C., an indium-tin alloy (containing 17.5 wt % Sn) was electrolyzed as an anode using a periodic reverse pulse current at a cathode current density of 600 A/m$^2$. The resulting precipitate at the bottom of the electrolytic cell was filtered, rinsed, and dried to obtain a mixed precipitate of indium hydroxide and metastannic acid.

It gave, upon roasting at 1100° C., an ITO powder having an average particle diameter of 18 μm and an apparent density of 1.7 g/cm$^3$.

From this ITO powder, an ITO sputtering target containing 10 wt % $SnO_2$ was fabricated by cold-press atmospheric sintering. The sintered body thus obtained had a density of 6.72 g/cm$^3$.

A clear conductive film formed by sputtering this ITO target was tested for their properties such as sheet resistance and transmissivity. The results were satisfactory and proved that the film was quite useful for LCD.

Example 4-2

Electrolysis was carried out using a periodic reverse pulse current under the same conditions as described in Example 4-1 with the exception that an aqueous solution of ammonium nitrate at an $NH_4NO_3$ concentration of 1.0 mol/l and pH 6 was used as the electrolytic bath at 50° C. The precipitate at the bottom of the electrolytic cell was filtered, rinsed, and dried to obtain a mixed precipitate of indium hydroxide and metastannic acid.

It was roasted at 1100° C. to give an ITO powder of a uniform particle size and high apparent specific gravity.

Using the resulting ITO powder and in the manner described in Example 4-1, an ITO sputtering target containing 10 wt % $SnO_2$ was made. The sintered body thus obtained had a density of 4.80 g/cm$^3$.

A clear conductive film formed by sputtering this ITO target was tested for their properties such as sheet resistance and transmissivity. The results made it certain that the film was very satisfactory and useful for LCD.

ADVANTAGE OF THE INVENTION

As described above, the present invention offers advantages useful for the art in that it can furnish an ITO powder fully satisfactory as a material, e.g., of sputtering targets for forming ITO films, at low cost while precisely meeting extensive property requirements of such powder.

What is claimed is:

1. A process for the preparation of an indium oxide-tin oxide powder which comprises electrolyzing indium as an anode in an aqueous solution of ammonium nitrate as the electrolyte to produce a precipitate of indium hydroxide, calcining or roasting the precipitate of indium hydroxide thus obtained to produce indium oxide, and combining the resulting indium oxide powder with a tin oxide powder.

2. A process for the preparation of an indium oxide-tin oxide powder according to claim 1, wherein the concentration of ammonium nitrate in the aqueous ammonium nitrate solution is between 0.2 to 5 moles per liter, the pH of the solution is between 4 and 9.5, the temperature of the solution is between 0° C. and 50° C. and the solution is subject to a current density of between 100 and 1800 A/m$^2$.

3. A process for the preparation of an indium oxide-tin oxide powder which comprises electrolyzing tin as an anode in an aqueous solution of ammonium nitrate as the electrolyte to produce a precipitate of metastannic acid, calcining or roasting the metastannic acid thus obtained to produce tin oxide, and combining the resulting tin oxide powder with an indium oxide powder.

4. A process for the preparation of an indium oxide-tin oxide powder according to claim 3, wherein the concentration of ammonium nitrate in the aqueous ammonium nitrate solution is between 0.2 to 5 moles per liter, the pH of the solution is between 4 and 9.5, the temperature of the solution is between 0° C. and 50° C. and the solution is subject to a current density of between 100 and 1800 A/m$^2$.

5. A process for the preparation of an indium oxide-tin oxide powder which comprises electrolyzing indium as an anode in an aqueous solution of ammonium nitrate as the electrolyte to produce a precipitate of indium hydroxide and calcining or roasting the resulting indium hydroxide to produce an indium oxide powder, while electrolyzing tin as an anode in an aqueous solution of ammonium nitrate as the electrolyte to produce a precipitate of metastannic acid and calcining or roasting the metastannic acid thus obtained to produce tin oxide, and then combining the two powders of indium oxide and tin oxide obtained.

6. A process for the preparation of an indium oxide-tin oxide powder according to claim 5, wherein the concentration of ammonium nitrate in the aqueous ammonium nitrate solution is between 0.2 to 5 moles per liter, the pH of the solution is between 4 and 9.5, the temperature of the solution is between 0° C. and 50° C. and the solution is subject to a current density of between 100 and 1800 A/m$^2$.

7. A process for the preparation of an indium oxide-tin oxide powder which comprises simultaneously electrolyzing indium and tin as separate anodes in the same electrolyzing cell in an aqueous solution of ammonium nitrate as the electrolyte to produce a mixed precipitate of indium hydroxide and metastannic acid and calcining or roasting the resulting mixed precipitate of indium hydroxide and metastannic acid to produce a mixed indium oxide-tin oxide powder.

8. A process for the preparation of an indium oxide-tin oxide powder according to claim 7, wherein the concentration of ammonium nitrate in the aqueous ammonium nitrate solution is between 0.2 to 5 moles per liter, the pH of the solution is between 4 and 9.5, the temperature of the solution is between 0° C. and 50° C. and the solution is subject to a current density of between 100 and 1800 A/m$^2$.

9. A process for the preparation of an indium oxide-tin oxide powder which comprises electrolyzing an alloy of indium and tin as an anode to produce a mixed precipitate of indium hydroxide and metastannic acid and calcining or roasting the resulting mixed precipitate of indium hydroxide and metastannic acid to produce a mixed indium oxide-tin oxide powder.

10. A process according to claim 9 wherein the alloy of indium and tin is electrolyzed using an aqueous solution of ammonium nitrate as the electrolyte.

11. A process for the preparation of an indium oxide-tin oxide powder according to claim 9, wherein the concentration of ammonium nitrate in the aqueous ammonium nitrate solution is between 0.2 to 5 moles per liter, the pH of the solution is between 4 and 9.5, the temperature of the solution is between 0° C. and 50° C. and the solution is subject to a current density of between 100 and 1800 A/m$^2$.

* * * * *